(12) United States Patent
Mandal et al.

(10) Patent No.: US 7,028,272 B2
(45) Date of Patent: Apr. 11, 2006

(54) REDUCING CELL LIBRARY DEVELOPMENT CYCLE TIME

(75) Inventors: Rituparna Mandal, Bangalore (IN); Dibyendu Goswami, Bangalore (IN); Sabyasachi Sengupta, Bangalore (IN); Arup Dash, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 546 days.

(21) Appl. No.: 10/119,046

(22) Filed: Apr. 10, 2002

(65) Prior Publication Data

US 2003/0131318 A1 Jul. 10, 2003

Related U.S. Application Data

(60) Provisional application No. 60/344,041, filed on Jan. 3, 2002.

(51) Int. Cl.
*G06F 17/50* (2006.01)
(52) U.S. Cl. ............... 716/2; 716/8; 716/9; 716/10; 716/11
(58) Field of Classification Search ............... 716/2, 716/8–15; 257/204, 349, 371
See application file for complete search history.

(56) References Cited

U.S. PATENT DOCUMENTS

| | | | | |
|---|---|---|---|---|
| 5,536,955 A | * | 7/1996 | Ali | ............... 257/204 |
| 5,808,900 A | * | 9/1998 | Buer et al. | ............... 716/10 |
| 5,914,887 A | * | 6/1999 | Scepanovic et al. | ............... 716/8 |
| 6,006,024 A | * | 12/1999 | Guruswamy et al. | ............... 716/12 |
| 6,020,614 A | * | 2/2000 | Worley | ............... 257/349 |
| 6,380,593 B1 | * | 4/2002 | Maxey et al. | ............... 257/371 |
| 6,385,760 B1 | * | 5/2002 | Pileggi et al. | ............... 716/8 |

OTHER PUBLICATIONS

S. Goto et al., "A 100W S-Band AlGaAs/GaAs Heterostructure FET for Base Stations of Wireless Personal Communications," IEEE, 1998, pp. 77-80.*

Matsuno et al., "A 500-mW High-Efficiency Si MOS MMIC Amplifier for 900-MHz-Band Use," IEEE, 2000, pp. 1407-1410.*

(Continued)

*Primary Examiner*—Vuthe Siek
(74) *Attorney, Agent, or Firm*—Alan K. Stewart; W. James Brady, III; Frederick J. Telecky, Jr.

(57) ABSTRACT

An integrated tool which allows layouts for cells to be generated using a combination of synthesis, migration and manual approaches. In an embodiment, a compaction tool of a migration engine/module is used to perform incremental compaction. Various utilities are developed to enable the use of the compaction tool. For example, when using synthesis to generate layout for a new combinational cell, a utility to generate inputs to the migration engine from pre-compaction representation of the synthesis tool is provided according to an aspect of the present invention. Another utility generates a device table indicating the manner in which each component of a pre-existing layout needs to be modified to generate a layout consistent with a target netlist. The device table and the pre-existing layout can be provided as an input to the migration engine to perform incremental compaction.

3 Claims, 4 Drawing Sheets

OTHER PUBLICATIONS

Sriram et al., "Reduction of Common-Source Inductance in FET/HEMT Structure Utilizing Wave-Propagation Effects," IEEE, 2000, pp. 406-411.*

Sagantec, Inc. (WWW.SAGANTEC.COM); Entitled: "Customer User Guide" in a Manual Entitled: "Sagantec Guides- Companion 2.0 User's and Customization Guide"; Dated Aug. 1998; (37 Pages).

Sagantec, Inc. (WWW.SAGANTEC.COM); Entitled: "Dreamv2.8 release notes & documentation" in a Manual Entitled: "Sagantec Guides-Dream 2.8 User's Guide"; Publication No. DUG-9808.© Copyright 1998, Sagantec; (3 Pages).

Sagantec, Inc. (WWW.SAGANTEC.COM); Entitled: "Dreamv2.8 User Guide Table of Contents" in a Manual Entitled: "Sagantec Guides-Dream 2.8 User's Guide"; Dated Aug. 1998; (3 Pages).

Sagantec, Inc. (WWW.SAGANTEC.COM); Entitled: "Getting Started" in a Manual Entitled: "Sagantec Guides-Dream 2.8 User's Guide"; Dated Aug. 1998; (23 Pages).

Sagantec, Inc. (WWW.SAGANTEC.COM); Entitled: "Process Description" in a Manual Entitled: "Sagantec Guides-Dream 2.8 User's Guide"; Dated Aug. 1998 (35 Pages).

Sagantec, Inc. (WWW.SAGANTEC.COM); Entitled: "Compaction" in a Manual Entitled: "Sagantec Guides-Dream 2.8 User's Guide"; Dated Aug. 1998; (35 Pages).

Sagantec, Inc. (WWW.SAGANTEC.COM); Entitled: "Migrate" in a Manual Entitled: "Sagantec Guides-Dream 2.8 User's Guide"; Dated Aug. 1998; (42 Pages).

Sagantec, Inc. (WWW.SAGANTEC.COM); Entitled: "Migration Engineering" in a Manual Entitled: "Sagantec Guides-Dream 2.8 User's Guide"; Dated Aug. 1998; (48 Pages).

Sagantec, Inc. (WWW.SAGANTEC.COM); Entitled: "Regular Cell Tools" in a Manual Entitled: "Sagantec Guides-Dream 2.8 User's Guide"; Dated Aug. 1998; (15 Pages).

Sagantec, Inc. (WWW.SAGANTEC.COM); Entitled: "CIF and Layout utilities" in a Manual Entitled: "Sagantec Guides-Dream 2.8 User's Guide"; Dated Aug. 1998; (31 Pages).

Sagantec, Inc. (WWW.SAGANTEC.COM); Entitled: "Reference" in a Manual Entitled: "Sagantec Guides-Dream 2.8 User's Guide"; Dated Aug. 1998; (24 Pages).

Sagantec, Inc. (WWW.SAGANTEC.COM); Entitled: "Application Notes" in a Manual Entitled: "Sagantec Guides-Dream 2.8 User's Guide"; Dated Aug. 1998; (27 Pages).

* cited by examiner

REDUCING CELL LIBRARY DEVELOPMENT CYCLE TIME

RELATED APPLICATION(S)

The present application is related to and claims priority from the co-pending U.S. Provisional Patent Application Ser. No. 60/344,041, entitled, "Reducing Cell Library Development Cycle Time", filed on Jan. 3, 2002, and is incorporated in its entirety herewith.

BACKGROUND OF THE INVENTION

The present invention relates to computer aided design of integrated circuits, and more specifically to a method and apparatus for reducing the time required for developing cell libraries.

BRIEF DESCRIPTION OF THE DRAWINGS

The present invention will be described with reference to the accompanying drawings, wherein.

DETAILED DESCRIPTION OF THE PREFERRED EMBODIMENTS

I. Overview and Discussion of the Invention

A single tool provided according to an aspect of the present invention enables layouts to be generated using a combination of synthesis, migration and manual approaches. As a result, high quality layouts can be generated for each cell in a library without consuming substantial amount of time.

According to another aspect of the present invention, a tool enables a user to conveniently specify different weights to be used associated with different variables used in placing the components of a cell. In an embodiment, the weights are used to compute a cost associated with several possible configurations, and the configuration with the least cost is chosen as the desired configuration.

One more aspect of the present invention enables a compaction module available in a migration tool to be used to fine-tune the placement of components of a cell layout.

Several aspects of the invention are described below with reference to example environments for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

II. Example Environment

Figure 1:
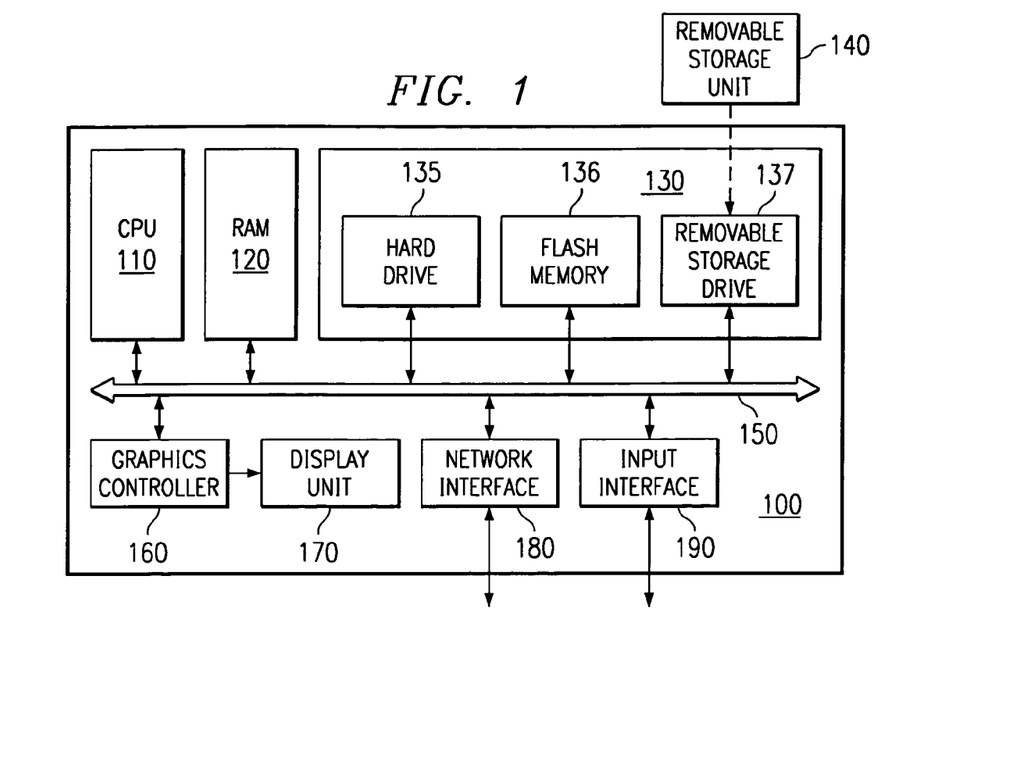
FIG. 1 is a block diagram of illustrating the details of an example environment in which the present invention can be implemented.

FIG. 1 is a block diagram of computer system 100 illustrating an example environment for implementing the present invention. Even though computer system 100 is described with specific components and architecture for illustration, it should be understood that the present invention may be implemented in several other types of embodiments. For example, the invention can be implemented on multiple cooperating networked computer systems. In addition, each component can be implemented as a combination of one or more of hardware, software and firmware, even though many features of the present invention are described herein as being implemented in software.

Computer system 100 may contain one or more processors such as central processing unit (CPU) 110, random access memory (RAM) 120, secondary memory 130, graphics controller 160, display unit 170, network interface 180, and input interface 190. All the components except display unit 170 may communicate with each other over communication path 150, which may contain several buses as is well known in the relevant arts. The components of FIG. 1 are described below in further detail.

CPU 110 may execute instructions stored in RAM 120 to provide several features of the present invention. CPU 110 may contain multiple processing units, with each processing unit potentially being designed for a specific task. Alternatively, CPU 110 may contain only a single processing unit. RAM 120 may receive instructions from secondary memory 130 using communication path 150. With reference to the present invention, the cell libraries may be stored and retrieved from secondary memory 130 during the execution of the instructions.

Graphics controller 160 generates display signals (e.g., in RGB format) to display unit 170 based on data/instructions received from CPU 110. Display unit 170 contains a display screen to display the images defined by the display signals. Input interface 190 may correspond to a key-board and/or mouse, and generally enables a user to provide inputs.

Network interface 190 may be implemented using protocols such as TCP/IP, ATM and/or Ethernet. In general, display unit 170, network interface 180 and input interface 190 enable a user to generate layouts of various cells in a library as described below.

Secondary memory 130 may contain hard drive 135, flash memory 136 and removable storage drive 137. Secondary storage 130 may store the software instructions and data (e.g., cell layouts, netlists, libraries), which enable computer system 100 to provide several features in accordance with the present invention. Some or all of the data and instructions may be provided on removable storage unit 140, and the data and instructions may be read and provided by removable storage drive 137 to CPU 110. Floppy drive, magnetic tape drive, CD-ROM drive, DVD Drive, Flash memory, removable memory chip (PCMCIA Card, EPROM) are examples of such removable storage drive 137.

Removable storage unit 140 may be implemented using medium and storage format compatible with removable storage drive 137 such that removable storage drive 137 can read the data and instructions. Thus, removable storage unit 140 includes a computer usable storage medium having stored therein computer software and/or data. An embodiment of the present invention is implemented using software running (that is, executing) in computer system 100.

In this document, the term "computer program product" is used to generally refer to removable storage unit 140 or hard disk installed in hard drive 135. These computer program products are means for providing software to computer system 100. An embodiment of the software is implemented based on Virtuoso Product Version 4.4.2 (along with Companion Tool developed by Segantec Corporation) available from Cadence Corporation (www.cadence.com).

As noted above, CPU 110 may retrieve the software instructions, and execute the instructions to provide various features of the present invention. The features of the present invention are described below in further detail.

III. Generating Cell Library

Figure 2:
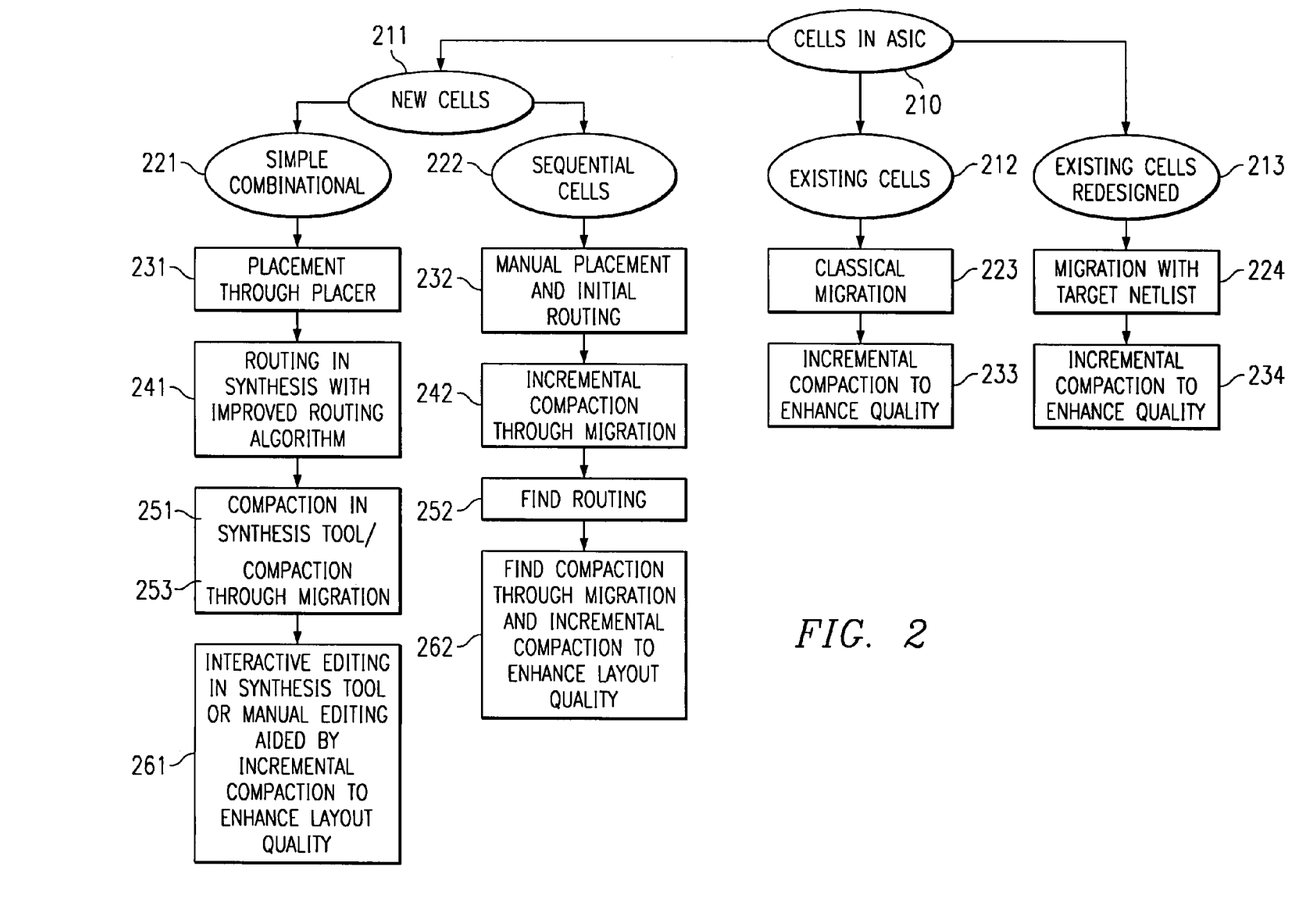
FIG. 2 is a diagram illustrating the manner in which the cycle time required for developing a cell library may be reduced according to an aspect of the present invention.

FIG. 2 is a diagram illustrating the manner in which a cell library may be generated in an embodiment of the present invention. In 210, the cells ("desired cells"), the layouts of which are required to be generated, are determined. Broadly, the desired cells may be classified into 3 categories—new cells, existing cells and existing cells requiring re-design, as depicted by 211–213 respectively.

New cells (211) generally refer to cells, the layout of which is not available from prior cell libraries. Existing cells (212) refer to cells having corresponding layouts consistent with rules for a prior technology. Existing cells requiring re-design (213) refer to cells having layouts for prior technology, but require redesign according to a target netlist. Such a re-design may be required, for example, because the components of a cell require nonuniform processing. For illustration, for a cell containing ten transistors, three transistors may require compaction by a first factor (e.g., 0.8) and the remaining may require compaction by another factor.

Various approaches can be used for classifying the cells. In an embodiment, a user indicates the specific classification of each desired cell, and the layouts are generated according to the specified classification. The manner in which the layouts are generated for new cells is described first below.

IV. New Cells

New cells may be further classified into 2 categories—combinational cells and the sequential cells as depicted by 221 and 222 respectively. In an embodiment, the classification is performed using a naming convention. That is, the name (label) chosen for each cell indicates whether the cell is combinational or sequential. For example, cells representing an OR logic gate may contain the word OR in a portion (first two characters) of the cell name. The description is continued with reference to generating the layout for combinational cells.

IV. A. Combinational New Cells

In 231, a placer may be used to place the transistors (forming the combinational cell) appropriately in the cell layout. In general, the placer places different components (e.g., transistors, pins) in different relative positions. An embodiment of placer is described in a section below.

In 241, routing is performed on the placed transistors to achieve desired connectivity between the transistors. Routing may be performed, for example, as described in a paper entitled, "Minimizing Area and Maximizing Porosity for Cell Layouts Using Innovative Routing Strategies", VLSI Conference, 2001 Bangalore, India, by Sabyasachi S., Sornavalli R., Dibyendu G., and Biswadeep C., which is incorporated in its entirety herewith.

In 251, compaction is performed on the components present in the cell layout using a compaction engine present in the synthesis tools. In general, compaction refers to shrinking the layout while enforcing the design rules.

If the quality of the compaction resulting from the synthesis tool is not deemed to be acceptable, an aspect of the present invention enables the pre-compaction layout to be compacted using a compaction tool available in migration module to be used in 253. However, the pre-compaction layout may be represented in a different format than the input data format for the compaction tool in the migration module. Accordingly, conversion may need to be performed. The conversion in an embodiment is described in a section below.

In 261, a user may interactively edit (the tool enforcing conformance with the design rules) the cell layout using the synthesis tool or manual edit using incremental compaction to enhance layout quality (261). The synthesis tool may be used to perform the manual editing. In general, a graphical user interface may be provided to enable the user to perform the manual editing. As a result, high quality layouts may be generated for combinational cells.

The description is continued with reference to an embodiment of placer (briefly noted in 231 above).

IV.A.1. Placer

It is often required to place transistors in a cell layout such that the area of the layout is minimal (high density). The area of the layout depends on the abutment of transistors. Abutment reduces transistor source/drain diffusion area and hence cell-width by merging same diffusion nets of adjacent transistors.

A placer has been developed based on simulated annealing. Simulated annealing is generally implemented based on a sequential optimization approach, which simulates the behavior of a slowly cooling physical system, arriving at an orientation with the lowest cost. Simulated annealing typically works in the following way.

```
evaluate(initial state); //cost of initial state
T = very high value//initial temperature
    while(! Terminating condition) {
    current state = random change (initial state);
        evaluate (current state);
        if(Costcurrent <= Costinitial) {
            initial state = current state;
        }
        else{
    if(e(Cost initial – Cost current)/ T>
    a random number between [0,1])
        {initial state = current state ; }
        }
        reduce T;
    } // end while
    optimal state = current state;
```

For applying simulated annealing an efficient and accurate cost determination logic is generally needed to evaluate a placement. The cost determination logic often includes estimated cell width, wire length and congestion. The placement module should be able to give optimal placement for wider variation of cells within a finite time.

However minimum area does not always assure the desired layout for routing intensive congested cells and may even result in unroutable or routing congested solution, compaction failure. As a result, the performance of the cell may be reduced. Therefore, the placer may be designed in a manner such that a user can tune the placer to obtain high density (minimum area) for a cell or high performance.

According to an aspect of the present invention, high performance for a cell can be obtained by assigning weight/cost for 'tie cost' and for 'finger combining cost' as described below with reference to an embodiment of cost determination logic.

IV.A.1.i Cost Determination Logic

The cost determination logic may contain various parameters such as area cost, interconnect cost, gate alignment cost, congestion cost, tie cost and finger combining cost. Each parameter is described in further detail below.

Area cost is a factor of estimated diffusion area. For a particular placement, diffusion area estimates the cell width compaction. The cell width is determined by max [PDIFFWidth, NDIFFWidth], that is, the greater of the two values, assuming edge routing do not increase cell width. Also, by reducing minimum [PDIFFWidth, NDIFFWidth], the space may be utilized for placing well/substrate contacts.

Area cost ("A") may be determined by the following equation:

$$A = N*\text{Max}[\text{PDIFFWidth}, \text{NDIFFWidth}] + \text{Min}[\text{PDIFFWidth}, \text{NDIFFWidth}] + \text{CostTie} \quad \text{Equation (1)}$$

Wherein
- 'N' represents a relative scale which gives higher preference to the first factor in the above equation and $N \ll 1$;
- 'CostTie' is a factor to give higher preference to placement of well/substrate contacts that lead to lesser layout area.

The estimated cell layout width may be determined by the following equation:

$$\text{Cell layout width} = \text{Max [PDIFFWidth, NDIFFWidth]} + 2*g \quad \text{Equation (2)}$$

Wherein 'g' represents the minimum separation of diffusion with boundary

With respect to interconnect cost, interconnect cost estimates the length of wire needed to connect the transistors in the cell layout. The interconnect cost often plays an important role to determine appropriate placement for routing intensive cells. Routing cost estimates the Manhattan interconnect length (well known in the relevant arts) of a placement and may be implemented as a linear function of metal wire cost ('Length-metal') and polysilicon wire cost (Length-poly). Interconnect cost can be determined by the following equation:

$$\text{Interconnect Cost} = \text{Scale}_{metal}*\text{Length-metal} + \text{Scale}_{poly}*\text{Length-poly} \quad \text{Equation (3)}$$

wherein $\text{Scale}_{metal}$ and $\text{scale}_{poly}$ respectively represent the relative weights assigned to the metal wire cost and polysilicon wire cost.

Metal wire cost and polysilicon wire cost are considered because metal and polysilicon differ in resistivity. For high density libraries polysilicon routing under power bus may be preferred over metal since cost of polysilicon is less than cost of metal. But for high performance library, metal may be preferred because of lesser resistivity property of metals. Most of the gate to gate routing however may be done through polysilicon to avoid use of contact as it adds to routing congestion in channel. The description is now continued with reference to gate alignment cost.

Gate alignment cost is included in the cost determination logic to compensate for problems due to misalignment. For smaller cell, misalignment of gates lead to unroutable solution. By increasing the cell layout area, the gates may be aligned, and thus better routing can be obtained. To connect unaligned gates and gates that are far apart polysilicon is less preferred because of high resistivity. Metal wire is also not preferred because it needs a polysilicon contact which is bigger in size.

Figure 3A:
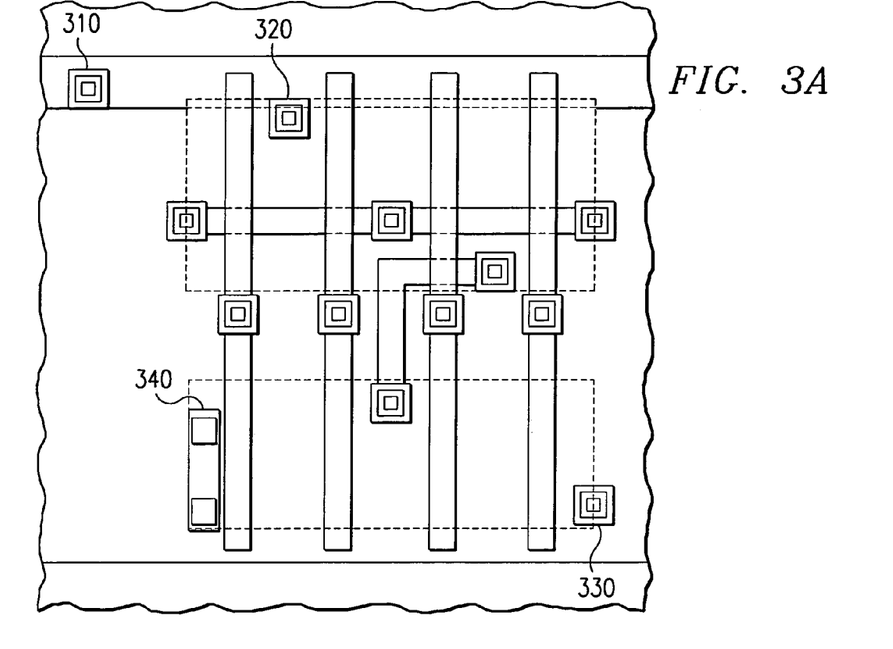
FIGS. 3A and 3B together illustrate the manner in which consideration of tie cost may lead to desired placement.
Figure 3B:
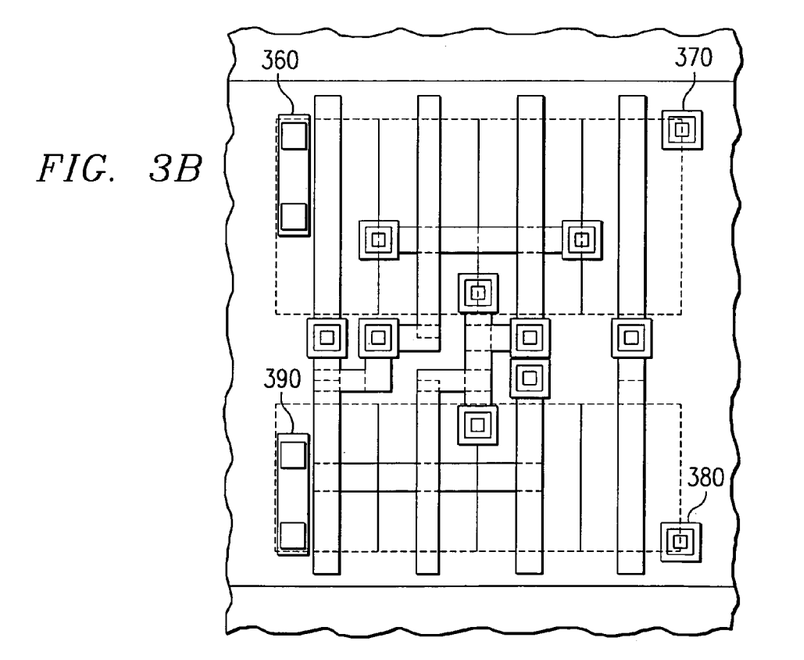

For a particular placement, consider the position of transistors as different indices of an array. Misalignment is referred to a situation when the gate of a the pmos transistor is not the same as the nmos. Experimentally, misalignment was determined to having a cost almost equaling K times of an additional diffusion gap, i.e., misalignment may be compromised for removal of K diffusion gaps wherein, 'K' is an integer independent of technology.

$$\text{Cost alignment} = K*[(\text{minimum distance between gates of two consecutive transistors with a diffusion gap in between}) - (\text{minimum distance between gates of two consecutive abutted transistors})] \quad \text{Equation (4)}$$

i.e. Cost alignment=$K*[\{2*(a+b+c)+e\}-d]$ (From FIG. 3) Equation (4)

The description is now continued with reference to congestion cost.

Congestion cost represents amount of routing congestion in the layout. Congestion cost generally estimates average number of wires passing through vertical cross section of layout. Congestion cost often plays an important role for routing intensive cells as cell height can be fixed and a fixed number of wires can pass through a layout cross section. Source, gate and drain of each transistor are the points of cross section.

If a wire (polysilicon/metal) runs from the source of a transistor to the drain of other transistor then congestion at each point of all the transistors below the wire is incremented by one. Congestion cost is a combination of two factors—average congestion ('Congav') and deviation from average congestion at each point ('CostdevCong').

Average congestion takes care of less congestion in the layout. Less congestion deviation from the average helps to avoid locally congested layout. If the congestion is very high for a sample point it may lead to compaction failure. CostdevCong is the sum of deviations for each sample point.

For example, consider 3 sample points with congestion 2,4 and 6 respectively and for another placement congestion are 4, 4 and 4. For both cases average congestion is equal, i.e., 4 but the later one can easily be compacted. For the first case deviation from average congestion equals 2 and 0 for the second. The description is continued with reference to tie cost.

Tie cost generally quantifies the overhead if power and/or ground are/is (voltage and ground together or individually) not placed at the edge of a layout. FIG. 3A represents a standard cell layout with standalone tie (in the PMOS side). Well tie (at 310) is placed stand alone (i.e., without the surrounding area not being used for other components), which consumes more area.

For further information on cell layouts, the reader is referred to a book entitled, "Application specific integrated circuit" by Michael John Sebastian Smith, Published by Addison Wesley, ISBN Number: 981-2235-893-5, which is incorporated in its entirety herewith. PMOS VDD (at 320)

net is shared between two transistors. But in NMOS, VSS is present in both the sides as shown at 330 and 340.

In comparison, when the Tie cost is considered and the layout is regenerated, the layout of FIG. 3B may be generated for the same cell (as in FIG. 3A). As may be readily observed, Vdd contacts (at points 360 and 370) and Vss contacts (380 and 390) are present at the edges. This placement has more wire length and poly bend. But the placement of FIG. 3B may be desirable as this allows to put embedded tie which takes lesser area. As a result, the over all cell area may be smaller (compared to FIG. 3A).

To enable such a layout, the cost determination logic of a placer may have a cost component for tie ($C_{tie}$). The computation of $C_{tie}$ in an embodiment may be understood by first appreciating that a standalone tie generally occupies more area than others (e.g., embedded tie). Hence a desirable feature is to use single embedded tie. For illustration, it is assumed that a standalone tie has area=S and an embedded tie has area=E.

Thus, if the area of a placement without tie =P, then the total area with a tie may equal (P+S) for standalone tie and (P+E) for embedded tie. As S>E, P+E<P+S, single embedded tie can be placed on a diffusion edge having net VDD/VSS (for pmos and nmos respectively). If a single embedded tie is placed near boundary, the area is lesser compared to that if placed in the middle. This is because the spacing between transistor and tie is more than spacing between tie and cell boundary. P and S can be derived from the design rules.

The area cost may be computed using the following pseudo-code:
// for pmos
pArea=pArea; //area of pmos side with out tie
if((left most diffusion net is VDD) or (right most diffusion net is VDD))
pArea+=E; //E=width of single embedded tie
else
pArea+=S; //S=width of standalone tie
//for nmos
nArea=nArea; //area of nmos side with out tie
if((left most diffusion net is VSS) or (right most diffusion net is VSS))
nArea+=E; //E=width of single embedded tie
else
nArea+=S; //S=width of standalone tie
Total_area_cost_with_tie=max(nArea, pArea)

This allows us to chose a latch-up free layout with minimal area. The description is continued with reference to finger combining cost.

In general, for high performance cells it may be desirable to keep all the fingers of a large transistor together. A finger generally refers to each of the parallel small transistors, which together operate effectively as the large transistor. In each of the large transistors, all gates of the small transistors are connected, all sources are connected and all are drains connected as illustrated with reference to FIG. 4. There are shown three large transistors 410, 420 and 430, each being effectively implemented by several small transistors.

Figure 4:
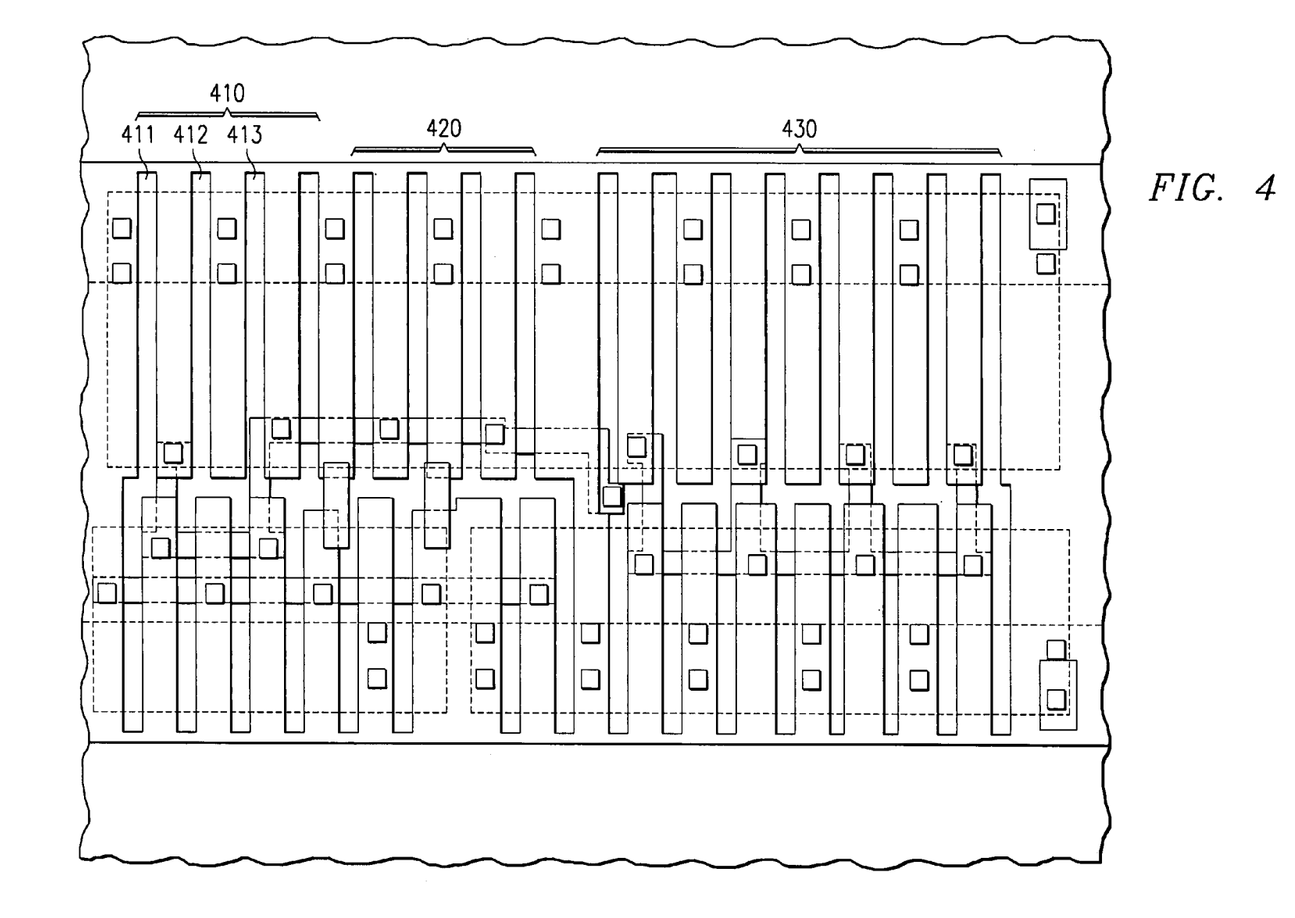
FIG. 4 illustrates the manner in which consideration of finger cost may lead to desired placement.

Large transistor 410 is shown containing (CMOS Component of) small transistors (fingers) 411–413. The corresponding NMOS components are also shown below but not described in the interest of conciseness. In general, placing fingers together leads to better performance as less interconnection is generally required. Thus, $C_{finger}$ is a measure of the penalty in wire-length cost if fingers are placed apart. Another placement can have lesser wire length with the fingers are not placed together. This is additional because we want to fingers to place together. This may lead to bigger area but for high performance cells this (larger area) is not an issue. This generally gives lesser wire length, congestion and hence performance, but may have higher area.

The manner in which $C_{tie}$ is computed in an embodiment is described now. A determination as to whether fingers are placed together or not may be made as follows:
Gate_combine_cost =0;
unique_gate_net[ ]; //stores unique nets connected to gate, and
unique_gate_num[ ]; //number of transistors connected to it
//for pmos
for(i=0; i<=maxIndex of unique_gate_net[ ]; i++){
left_index=find the leftmost transistor connected to the net;
right_index=find the rightmost transistor connected to the net;
diff=right_index−left_index;
if (unique_gate_num[i]==diff+1){
fingers are together for net unique_gate_net[i];
Gate_combine_cost=Gate_combine_cost−delta; // delta has a
//positive value for high-performance
// technology, 0 for high density
}}

The cost determination logic may be implemented based on all the above cost factors.

That is,
cost (placement)
{return(Scale$_{abutment}$*Area_Cost( )+Scale$_{interconnect}$*Interconnect_cost( )+Scale$_{alignment}$*Alignment_cost( )+Scale$_{congestion}$*Congestion_cost( )+Scale$_{tie}$*Tie_cost( )+Scale$_{finger}$* finger_cost ( ));
}

In the alternative, a different weight (scale) may be assigned to each of the costs such that the layout for each cell can be based on specific desired considerations. The manner in which different weights may be assigned to different factors in an embodiment is described below.

IV.A.1.ii. Different Cost Determination Logic for Different Cells

An aspect of the present invention enables a user to specify different cost determination logic for different cells (depending on the specific requirements). In an embodiment, a user may be provided the option of specifying in a cost file a weight associated with each cost. The cost factor for each variable may be multiplied by the associated weight in determining the placement cost for each configuration.

For illustration, the cost file may contain the following weights associated with the different variables.
HIGHDENSITY 1# means the technology is high density
ALLFINGERSTOGETHER 0# Do not combine fingers together this internally sets # weight for finger combine cost to 0.
CONTWIDTH 0.24# contact width
CELLHEIGHT 5.00# cell height
NWELLLOC 2.00# nwell location
ALIGNSCALE 1# gate alignment weight
ABUTSCALE 4# area cost
WIRESCALE 0.8# wire length cost
CONGSCALE 0.1# congestion cost
TIESCALE 1# tie cost The above configuration is generally suitable for high density technology. On the other hand, for high performance, the cost file may contain the following entries:

HIGHDENSITY 0# means the technology is for high performance
ALLFINGERSTOGETHER 1# Combine fingers together, this may internally set a default weight for finger combine cost.
CONTWIDTH 0.24# contact width
CELLHEIGHT 6.00# cell height
NWELLLOC 3.00# nwell location
ALIGNSCALE 2# gate alignment weight
ABUTSCALE 2# area cost
WIRESCALE 1# wire length cost
CONGSCALE 1# congestion cost
TIESCALE 1# tie cost Placer calculates the cost of a placement based on this above weights. Thus, a user may specify different weights consistent with the requirements (e.g., high performance or density as in the above two examples), and cause the corresponding layout to be generated. In other words, the placer module can be used with different technologies without having to re-compile the corresponding software code.

While the cost determination logic of above is described as merely enabling a user to change weights associated with various variables, it should be understood that the described embodiments may be extended to implement entirely different logic (e.g., a different equation for computation of cost) for different types of cells, as will be apparent to one skilled in the relevant arts based on the disclosure provided herein. Such implementations are contemplated to be within the scope and spirit of several aspects of the present invention. For example, one equation may be used if HIGHDENSITY is set to 0 and another equation may be used otherwise.

According to another aspect of the present invention, a command line interface is provided which enables a user to interactively specify different weights (scales) to be specified associated with each cost variable. For example, different values may be specified associated with ALIGNSCALE and ABUT_SCALE. Such an interactive feature makes the placer tunable for every cell. The feature could be particularly useful if the desired quality of the layouts is not determined beforehand.

The description is continued with respect to an embodiment which converts the pre-compaction output of a synthesis tool to a format suitable for use by incremental compaction as noted above with respect to 251 of FIG. 2 above.

IV.A.2. Conversion to Enable Compaction of the Layout Generated by Synthesis

As noted briefly above with respect to 251 of FIG. 2, placement, routing and compaction may be performed in normal synthesis flow while generating the cell layout for combinational cells. The compaction engine of the synthesis tool may sometimes fail to generate production quality layouts. In some complex cells, even if the routing is complete, the compactor fails to compact the cell. In such situations, the cell may need to be compacted through migration.

A translator may need to be designed to convert the pre-compacted cell layout to a format that the migration tool may process appropriately. The pre-compacted layout may be referred to as symbolic layout as it contains the layout components such as transistors, wires, contacts, etc, without typically satisfying the design rules.

In general, translators need to be implemented taking into consideration the format (syntax and semantics) of the source file (symbolic layout in the present example) and the format of the compaction tool in the migration engine (module). The symbolic layout information may be converted into intermediate data formats to the extent additional translators are present for eventual conversion into the format of the compaction tool of the migration engine.

Several implementations will be apparent to one skilled in the relevant arts based on the disclosure provided herein, and such implementations are contemplated to be within the scope and spirit of several aspects of the present invention. In an embodiment, symbolic layout data is first converted to GDS format (well known in the relevant arts), and the GDS format data is then converted into CDS data format (of Virtuoso database from Cadence Corporation).

Once the output of the synthesis tool is converted to a format suitable for processing by migration engine, the layout may be compacted consistent with the design rules. As noted above with reference to 261, the output of the migration tools may be further edited potentially interactively to generate high quality layouts for the combinational cells. The description is continued with reference to generating high quality layouts for the sequential cells determined in 222.

IV. B. Sequential New Cells

Continuing with reference to FIG. 2, in 232, sequential cells required for the cell layout are manually placed in the cell layout. The initial routing between the transistors may also be performed manually. The manual placement and routing may be performed in a known way.

In 242, incremental compaction is performed on the cell layout through migration. Incremental compaction is described in further detail in a section below.

Final routing (252) may be performed on the transistors after incremental compaction. Compaction (262) may be performed again through migration and incremental compaction to enhance the cell layout quality.

V. Existing Cells

Continuing with reference to (existing cells of 212) FIG. 2, in 223, the cell layouts may be generated using a conventional migration tool. In general, large blocks or custom cells like data path, are ported from one technology to another without substantial change in design topology. Typically, migration is used in situations when the components of a cell need to be processed in a uniform manner.

The layout generated may not be of hand-crafted quality. Accordingly, incremental compaction may be performed on the output of the migration tool to achieve better suited layouts. An embodiment performing incremental compaction is described below in greater detail.

However, migration may not be suited in situations in which topology (placement or routing) needs to be at least slightly changed or when non-uniform design rules are to be applied. For example, conventional migration may not be particularly useful in a situation in which a cell originally designed for high-density needs to be migrated to a high performance library generally characterized by bigger transistors but free routing track under each power bus (which will be used for routing at chip level). Accordingly, the below noted approach may be used at least in such situations.

VI. Existing Cells Re-Designed

With reference to the cells that require redesign (identified in 213 of FIG. 2), in 224, the cell layouts are generated using a migration tool from target netlists. The target netlists may contain the new values of cell height or width using which the cell layout is generated. In 234, incremental compaction is performed on the cell layout to enhance the quality. Example embodiments implementing 224 and 234 are described below in detail.

VI. A. Migration with Target Netlist

Migration using target (desired) netlist is described with reference to an example. Hypothetically it is assumed that a cell present in one library is to be ported to a new library after changing the transistor sizes to improve the cell performance. The manner in which the migration may be performed is described below.

In an embodiment, the migration tool receives a device table containing a transistor name (any arbitrary name), old and new sizes of the transistor and position coordinates. In general, a device table refers to a data structure which is used to represent the old and new parameters in migrating a old layout to a new layout.

The migration tool is provided a layout and the device table, and a new layout is generated with the modifications indicated by the device table. In general, a device table may be used to indicate the new and old parameters corresponding to the old and target layouts respectively. Accordingly it may be necessary to generate a device table based on the prior layout and the target netlist.

Figure 5:
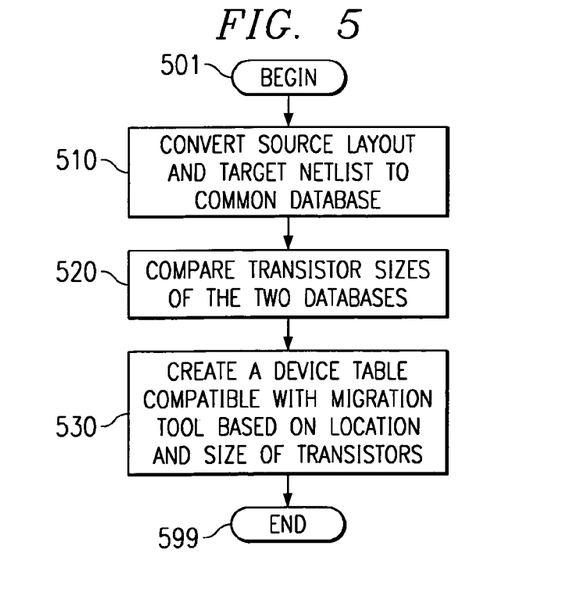
FIG. 5 is a flow chart illustrating the details of an embodiment of a utility which generates a device table used to generate a layout consistent with a new target netlist when a cell of the same functionality pre-exists.

The manner in which the device table can be generated is described below with reference to FIG. 5. FIG. 5 is a flow chart illustrating the manner in which a device table can be generated. The flow chart begins in step 501, in which control immediately passes to step 510.

In step 510, the source layout and the target netlist are converted to a common database format which lends to further analysis as described in the steps below. In an embodiment, schematic variation data base (SVDB), the details of which is available from K2 Technologies, Inc. (http://www.k2tech.com/), is used as the common data base.

In step 520, a comparison is made between the source layout and the target netlists to determine any mismatch in the transistor sizes. The coordinates of the transistors of the source layout may also be determined along with the size mismatch. Thus, steps 510 and 520 together operate to determine the size mismatches and coordinates of the transistors of the source layout.

In step 530, the tool automatically generates a device table for each cell based on the comparison results of step 520. The device table consists of the transistor name, its position coordinates and the old and new sizes.

The newly created device table is provided to the migration tool instead of any device table that was automatically generated by the tool. A new layout is generated based on the device table and the prior layout. Thus, a pre-existing cell can be redesigned according to a new target netlist according to an aspect of the present invention.

However, the quality of layout thus generated may not be of acceptable quality. Accordingly, incremental compaction may be performed through migration as described below in further detail.

VI. B. Incremental Compaction Through Migration

Migration generally refers to porting a cell from one technology to another when there is change in layout design rules (such as transistor width) but the topology remains at least substantially unchanged. The inputs to the migration tool typically are the cell layouts of a prior technology and the design rules and the standard cell architecture information for the target technology.

With respect to enhancing quality in 234, the device table generated by the flow chart of FIG. 5 along with the prior layout can be directly provided as inputs to a migration tool to compact the layout further. A user can further manually edit the layout while the migration tool enforces the design rules. As a result, layouts of hand-crafted quality can be generated for the existing cells of 213.

With respect to existing cells of 212, incremental compaction can be performed by allowing a user to edit the layouts manually. The compaction engine within the migration tool may again enforce the design rules.

With respect to sequential cells of 222, it is helpful to first understand that an embodiment of migration tool has an interface to the layout editor. The feature may be used to implement the migration tool as a compaction engine as described below.

Using the netlist for the new cell, the transistors (with the respective sizes) are appropriately placed in the cell layout. An initial level of routing is performed manually (232). The layout thus created may be provided as an input to the layout editor. The migration engine may operate as an integral component of the layout editor and thus incremental compaction can be performed on the sequential cells of 222.

It should be understood that a designer need not consider the design rules with respect to the various layout geometries (like the width of the metal wire, or the contact widths, or the metal overlap of contact etc.) while placing the transistors or routing them. This is because when incremental compaction is performed on the layout, the compaction engine of the migration tool enforces the design rules on the layout, thereby enabling the convenient generation of hand-crafted quality layouts for sequential cells of 222.

With respect to 261, incremental compaction may be performed using the migration tool as compaction has already been performed using the migration tool in 253. Thus, handcrafted quality for placement and routing of transistors and automatic compaction through migration may be obtained.

As a result, reduction of cycle time for generating layouts may be achieved by using several aspects of the present invention.

VII. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of determining an optimal placement for a layout of a cell, said method comprising:
   providing a cost determination logic using a tie cost, wherein said tie cost quantifies an overhead if power and/or ground are/is not placed at the edge of a layout;
   determining a first cost result for a first placement of said cell and determining a second cost result for a second placement of said cell, wherein said first cost result and said second cost result are generated using said cost determination logic; and selecting either said first placement or said second placement as a desired placement according to said first cost result and said second cost result wherein said cost determination logic is designed to also consider area cost, alignment cost, congestion cost and finger cost along according to corresponding weights in determining said cost results.

2. A computer readable medium carrying one or more sequences of instructions for causing a computer system to determine an optimal placement for a layout of a cell, wherein execution of said one or more sequences of instructions by one or more processors contained in said computer system causes said one or more processors to perform the actions of:

providing a cost determination logic using a tie cost, wherein said tie cost quantifies an overhead if power and/or ground are/is not placed at the edge of a layout;

determining a first cost result for a first placement of said cell and determining a second cost result for a second placement of said cell, wherein said first cost result and said second cost result are generated using said cost determination logic; and selecting either said first placement or said second placement as a desired placement according to said first cost result and said second cost result, wherein said cost determination logic is designed to also consider area cost, interconnect cost, alignment cost, congestion cost and finger cost along according to corresponding weights in determining said cost results.

3. A computer system for determining an optimal placement for a layout of a cell, said computer system comprising:

means for providing a cost determination logic using a tie cost, wherein said tie cost quantifies an overhead if power and/or ground are/is not placed at the edge of a layout;

means for determining a first cost result for a first placement of said cell and determining a second cost result for a second placement of said cell, wherein said first cost result and said second cost result are generated using said cost determination logic; and means for selecting either said first placement or said second placement as a desired placement according to said first cost result and said second cost result, wherein said cost determination logic is designed to also consider area cost, interconnect cost, alignment cost, congestion cost and finger cost along according to corresponding weights in determining said cost results.

* * * * *